(12) United States Patent
Hirabayashi et al.

(10) Patent No.: US 9,536,961 B2
(45) Date of Patent: Jan. 3, 2017

(54) REVERSE CONDUCTING INSULATED GATE BIPOLAR TRANSISTOR

(71) Applicant: TOYOTA JIDOSHA KABUSHIKI KAISHA, Toyota-shi, Aichi-ken (JP)

(72) Inventors: Yasuhiro Hirabayashi, Nagoya (JP); Hiroshi Hosokawa, Toyota (JP); Yoshifumi Yasuda, Nisshin (JP); Akitaka Soeno, Toyota (JP); Masaru Senoo, Okazaki (JP); Satoru Machida, Nagakute (JP); Yusuke Yamashita, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/925,146

(22) Filed: Oct. 28, 2015

(65) Prior Publication Data
US 2016/0172453 A1    Jun. 16, 2016

(30) Foreign Application Priority Data
Dec. 12, 2014  (JP) .................. 2014-251967

(51) Int. Cl.
| | | |
|---|---|---|
| H01L 29/73 | (2006.01) | |
| H01L 29/417 | (2006.01) | |
| H01L 29/739 | (2006.01) | |
| H01L 29/10 | (2006.01) | |

(52) U.S. Cl.
CPC ..... H01L 29/41708 (2013.01); H01L 29/1095 (2013.01); H01L 29/7397 (2013.01)

(58) Field of Classification Search
CPC ............. H01L 2924/00; H01L 29/7397; H01L 29/1095; H01L 29/66348
USPC .................................. 257/144, 77, 341, 335
See application file for complete search history.

(56) References Cited

U.S. PATENT DOCUMENTS

| | | | | |
|---|---|---|---|---|
| 2013/0341674 A1* | 12/2013 | Werber | ................... | H01L 29/32 257/140 |
| 2014/0048847 A1 | 2/2014 | Yamashita et al. | | |
| 2014/0084332 A1* | 3/2014 | Lee | ..................... | H01L 29/7397 257/139 |

FOREIGN PATENT DOCUMENTS

JP    2013-048230 A    3/2013

* cited by examiner

*Primary Examiner* — Whitney T Moore
*Assistant Examiner* — Rodolfo D Fortich
(74) *Attorney, Agent, or Firm* — Oliff PLC

(57) ABSTRACT

A semiconductor layer of a reverse conducting insulated gate bipolar transistor is provided with a drift region of a first conductive type, a body region of a second conductive type that is disposed above the drift region, and a barrier region of the first conductive type that is disposed in the body region and electrically connects to the emitter electrode via a pillar member which extends from the one of main surfaces of the semiconductor layer. The barrier region is not contact with a side surface of the insulated trench gate.

5 Claims, 10 Drawing Sheets

REVERSE CONDUCTING INSULATED GATE BIPOLAR TRANSISTOR

CROSS-REFERENCE TO RELATED APPLICATION

This application claims priority to Japanese Patent Application No. 2014-251967 filed on Dec. 12, 2014, the contents of which are hereby incorporated by reference into the present application.

TECHNICAL FIELD

The technique disclosed in the present application relates to a reverse conducting insulated gate bipolar transistor.

DESCRIPTION OF RELATED ART

A reverse conducting insulated gate bipolar transistor (hereinafter, referred to as "reverse conducting IGBT") in which a diode is built in a semiconductor layer with an insulated gate bipolar transistor formed therein has been developed. A reverse conducting IGBT of this type is often used in six transistors configuring a three-phase inverter, and the diode operates as a Free Wheeling Diode (FWD).

It has been desired to reduce switching loss in the reverse conducting IGBT by improving reverse recovery characteristics of the diode built in the reverse conducting IGBT. In order to improve the reverse recovery characteristics of the built-in diode, it is important to restrict a quantity of holes injected from a body region (i.e., an anode region in the built-in diode) while the built-in diode is forward-biased.

JP 2013-48230 A proposes a technique for improving the reverse recovery characteristics of a built-in diode. FIG. 9 shows a schematic view of a reverse conducting IGBT 100 disclosed in JP 2013-48230 A. In order to restrict the quantity of holes injected from a body region 115, this reverse conducting IGBT 100 includes an n-type barrier region 118 provided in a p-type body region 115. A body region 115 disposed on a higher side of the barrier region 118 is called an upper body region 115a whereas a body region 115 disposed on a lower side of the barrier region 118 is called a lower body region 115b. The barrier region 118 is electrically connected to an emitter electrode 124 via an n-type pillar region 119 extending from a main surface of a semiconductor layer and in Schottky-contact with the emitter electrode 124.

If the built-in diode is forward-biased, the barrier region 118 and emitter electrode 124 short-circuit via the pillar region 119. At this time, a potential of the barrier region 118 becomes lower than that of the emitter electrode 124 by an amount corresponding to a forward voltage of the Schottky junction of the pillar region 119 and the emitter electrode 124. The forward voltage of the Schottky junction is lower than a built-in voltage of a PN diode configured by the upper body region 115a and the barrier region 118. Accordingly, by virtue of the provision of the barrier region 118, sufficient forward voltage is not applied to the PN diode configured by the upper body region 115a and the barrier region 118, thus restricting the quantity of holes injected from the upper body region 115a.

BRIEF SUMMARY OF INVENTION

In the reverse conducting IGBT 100, as shown in broken lines in FIG. 9, the barrier regions 118 are in contact with side surfaces of insulated trench gates 130. Therefore, a parasitic NMOS composed of the barrier regions 118, the lower body region 115b, and the drift region 114 are present on the side surfaces of the insulated trench gates 130. Due to this, when a positive voltage is applied to the insulated trench gates 130, the parasitic NMOS is turned on before reaching a threshold value. As a result of this, a collector current Ic rises in two steps in relation to an increase in a gate voltage Vg, as shown in FIG. 10 (hereinafter, this phenomenon is called "a two-step ON phenomenon"). Such two-step ON phenomenon may result in malfunction, noise, and erroneous detection of a defective product.

This specification provides a reverse conducting IGBT that inhibits occurrence of a two-step ON phenomenon.

One aspect of a reverse conducting insulated gate bipolar transistor disclosed in this specification comprises a semiconductor layer, an emitter electrode covering one of main surfaces of the semiconductor layer, and an insulated trench gate extending from the one of main surfaces of the semiconductor layer into the semiconductor layer. The semiconductor layer comprises a drift region of a first conductive type, a body region of a second conductive type and a barrier region of the first conductive type. The drift region is in contact with the insulated trench gate. The body region is disposed above the drift region and is in contact with the insulated trench gate. The barrier region is disposed in the body region and electrically connects to the emitter electrode via a pillar member which extends from the one of main surfaces of the semiconductor layer. In the one of the reverse conducting insulated gate bipolar transistor, the barrier region is not in contact with a side surface of the insulated trench gate.

In the reverse conducting IGBT according to the foregoing embodiment, since the barrier region is not in contact with a side surface of the insulated trench gate, a parasitic NMOS composed of the barrier region, the body region, and the drift region is not present on the side surface of the insulated trench gate. Accordingly, in the reverse conducting IGBT in the present aspect, occurrence of the two-step ON phenomenon is inhibited.

DETAILED DESCRIPTION OF INVENTION

Figure 1:
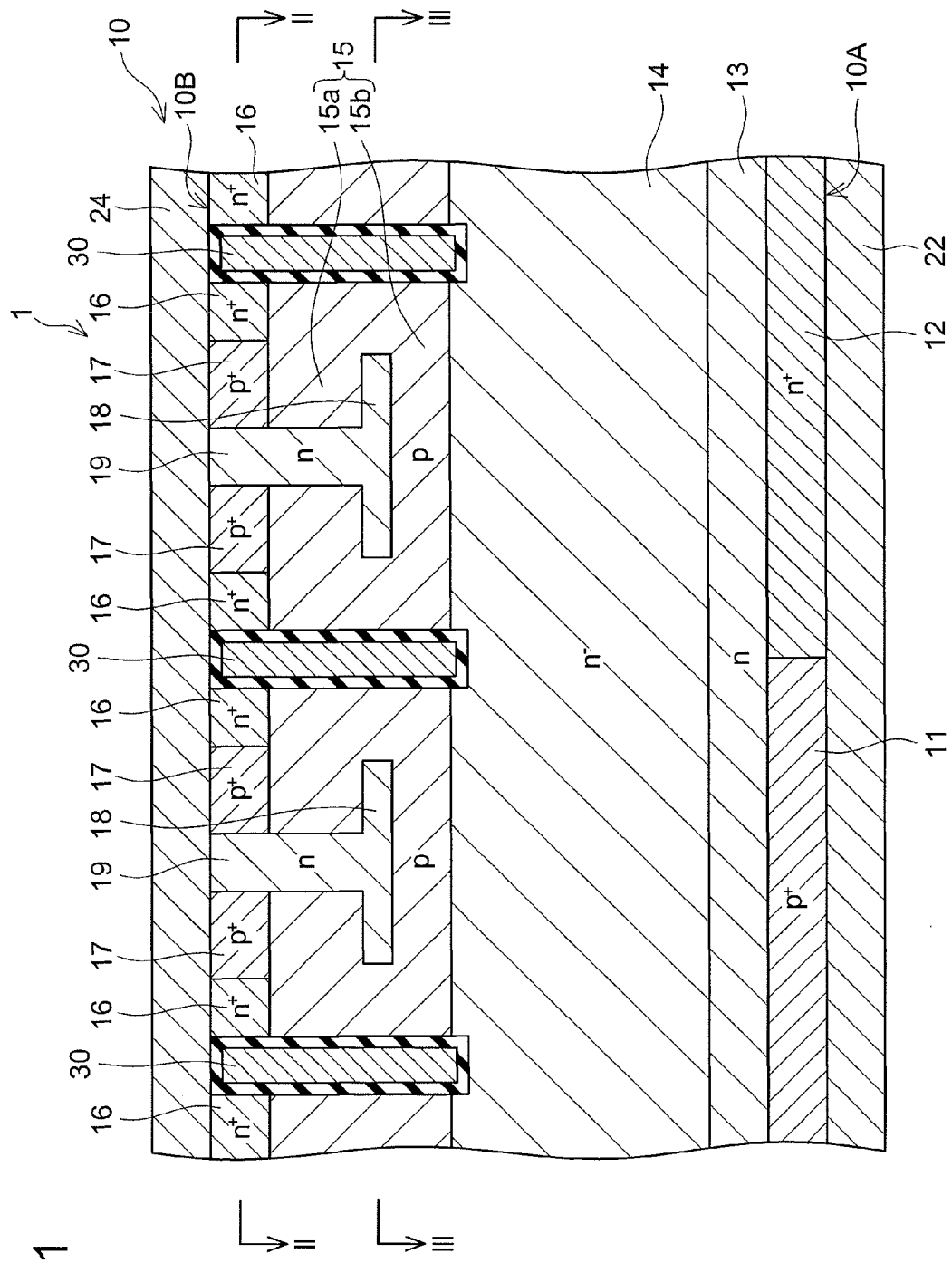
FIG. 1 shows schematically a cross section of a main part of a reverse conducting IGBT according to an embodiment.

Some of technical features disclosed in this specification are summarized below. Note that matters described below respectively independently have technical utility.

One aspect of a reverse conducting insulated gate bipolar transistor disclosed in this specification may comprise a semiconductor layer, an emitter electrode covering one of main surfaces of the semiconductor layer, and an insulated trench gate extending from the one of main surfaces of the semiconductor layer into the semiconductor layer. A material of the semiconductor layer is not particularly limited. For example, the material of the semiconductor layer may be silicon, silicon carbide or other compound semiconductors. The semiconductor layer may comprise a drift region of a first conductive type, a body region of a second conductive type and a barrier region of the first conductive type. The drift region may be in contact with the insulated trench gate. The body region may be disposed above the drift region and is in contact with the insulated trench gate. The barrier region may be disposed in the body region and may electrically connect to the emitter electrode via a pillar member which extends from the one of main surfaces of the semiconductor layer. The pillar member may be configured to electrically connect the barrier region with the emitter electrode for adjusting a potential of the barrier region so that a quantity of carriers injected from the body region is restricted when the reverse conducting insulated gate bipolar transistor is being turned ON. For example, the pillar member may be a semiconductor region of the first conductive type that is in Schottky-contact with the emitter electrode. In the reverse conducting insulated gate bipolar transistor according to this aspect, the barrier region may not be in contact with a side surface of the insulated trench gate. It is preferable that a distance by which the barrier region is set apart from the side surface of the insulated trench gate is longer than a width of an inversion layer that is generated at the side surface of the insulated trench gate.

The semiconductor layer may further comprise a floating region of the first conductive type, wherein a potential of the floating region is floating. The floating region may be disposed in the body region. In a view along a direction orthogonal to the one of main surfaces of the semiconductor layer, the floating region may be located in at least a portion between the side surface of the insulated trench gate and the barrier region. The floating region may be in contact with the side surface of the insulated trench gate, or may be set apart from the side surface of the insulated trench gate. The floating regions may be dispersed between the side surface of the insulated trench gate and the barrier region. When the floating region is provided, ON voltage of the reverse conducting insulated gate bipolar transistor decreases.

The floating region may be located on a lower side with respect to the barrier region in a depth direction of the semiconductor layer. In this aspect, ON voltage of the reverse conducting insulated gate bipolar transistor further decreases.

The floating region may extend from the side surface of the insulated trench gate to an overlapping area with the bather region in the view along the direction orthogonal to the one of main surfaces of the semiconductor layer. In this aspect, ON voltage of the reverse conducting insulated gate bipolar transistor further decreases.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved reverse conducting insulated gate bipolar transistors, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Embodiment

A reverse conducting IGBT 1 will now be described with reference to the drawings. The reverse conducting IGBT 1 is used in six transistors configuring a three-phase inverter, and a diode built therein operates as a Free Wheeling Diode (FWD).

As shown in FIG. 1, the reverse conducting IGBT 1 includes a semiconductor layer 10 of a single crystal silicon, a collector electrode 22 (cathode electrode in diode) covering a back surface 10A of the semiconductor layer 10, an emitter electrode 24 (anode electrode in diode) covering a front surface 10B of the semiconductor layer 10, and a plurality of insulated trench gates 30 provided in a surface layer of the semiconductor layer 10. The semiconductor layer 10 includes a p-type collector region 11, an n-type cathode region 12, an n-type buffer region 13, an n-type drift region 14, a p-type body region 15 (anode region in diode), n-type emitter regions 16, p-type body contact regions 17, n-type barrier regions 18, and n-type pillar regions 19.

The collector region 11 is disposed in a back layer of the semiconductor layer 10, and exposed on the back surface 10A of the semiconductor layer 10. The collector region 11 contains high concentration boron and is in ohmic contact with the collector electrode 22. The collector region 11 is formed by introducing boron into a part of the back layer of the semiconductor layer 10 from the back surface 10A of the semiconductor layer 10 by using, for example, an ion implantation technique.

The cathode region 12 is disposed in the back layer of the semiconductor layer 10, and exposed on the back surface 10A of the semiconductor layer 10. The cathode region 12 contains high concentration phosphorus and is in ohmic contact with the collector electrode 22. The cathode region 12 is formed by introducing phosphorus into a part of the back layer of the semiconductor layer 10 from the back surface 10A of the semiconductor layer 10 by using, for example, the ion implantation technique.

The reverse conducting IGBT 1 is characterized in that the collector region 11 and cathode region 12 are provided in the back layer of the semiconductor layer 10. The collector region 11 and cathode region 12 are disposed in a same plane in the back layer of the semiconductor layer 10. Thus, the reverse conducting IGBT 1 is able to operate as an IGBT as well as a diode. It is to be noted that a layout of the collector region 11 and cathode region 12 in the back layer of the semiconductor layer 10 is not limited to a particular one but various layouts may be employed.

The buffer region 13 is disposed in the back layer of the semiconductor layer 10. The buffer region 13 is disposed on the collector region 11 and cathode region 12. The buffer region 13 is formed by introducing phosphorus into a part of the back layer of the semiconductor layer 10 from the back surface 10A of the semiconductor layer 10 by using, for example, the ion implantation technique. An impurity concentration of the buffer region 13 is higher than that of the drift region 14.

The drift region 14 is disposed between the buffer region 13 and the body region 15. The drift region 14 is a part remaining after each semiconductor region has been formed in the semiconductor layer 10 and its impurity concentration is low.

The body region 15 is disposed in the surface layer of the semiconductor layer 10. The body region 15 is disposed on the drift region 14 and surrounds the emitter regions 16, body contact regions 17, barrier regions 18, and pillar regions 19. The body region 15 is formed by introducing boron into a part of the surface layer of the semiconductor layer 10 from the front surface 10B of the semiconductor layer 10 by using, for example, the ion implantation technique. The body region 15 is divided into an upper body region 15a disposed on a higher side of the barrier region 18 and a lower body region 15b disposed on a lower side of the barrier region 18.

Each emitter region 16 is disposed in the surface layer of the semiconductor layer 10. The emitter region 16 is disposed on the body region 15 and exposed on the front surface 10B of the semiconductor layer 10. The emitter region 16 contains high concentration phosphorus and is in ohmic contact with the emitter electrode 24. The emitter region 16 is formed by introducing phosphorus into a part of the surface layer of the semiconductor layer 10 from the front surface 10B of the semiconductor layer 10 by using the ion implantation technique.

Each body contact region 17 is disposed in the surface layer of the semiconductor layer 10. The body contact region 17 is disposed on the body region 15 and exposed on the front surface 10B of the semiconductor layer 10. The body contact region 17 contains high concentration boron and is in ohmic contact with the emitter electrode 24. The body contact region 17 is formed by introducing boron into a part of the surface layer of the semiconductor layer 10 from the front surface 10B of the semiconductor layer 10 by using, for example, the ion implantation technique.

Figure 2:
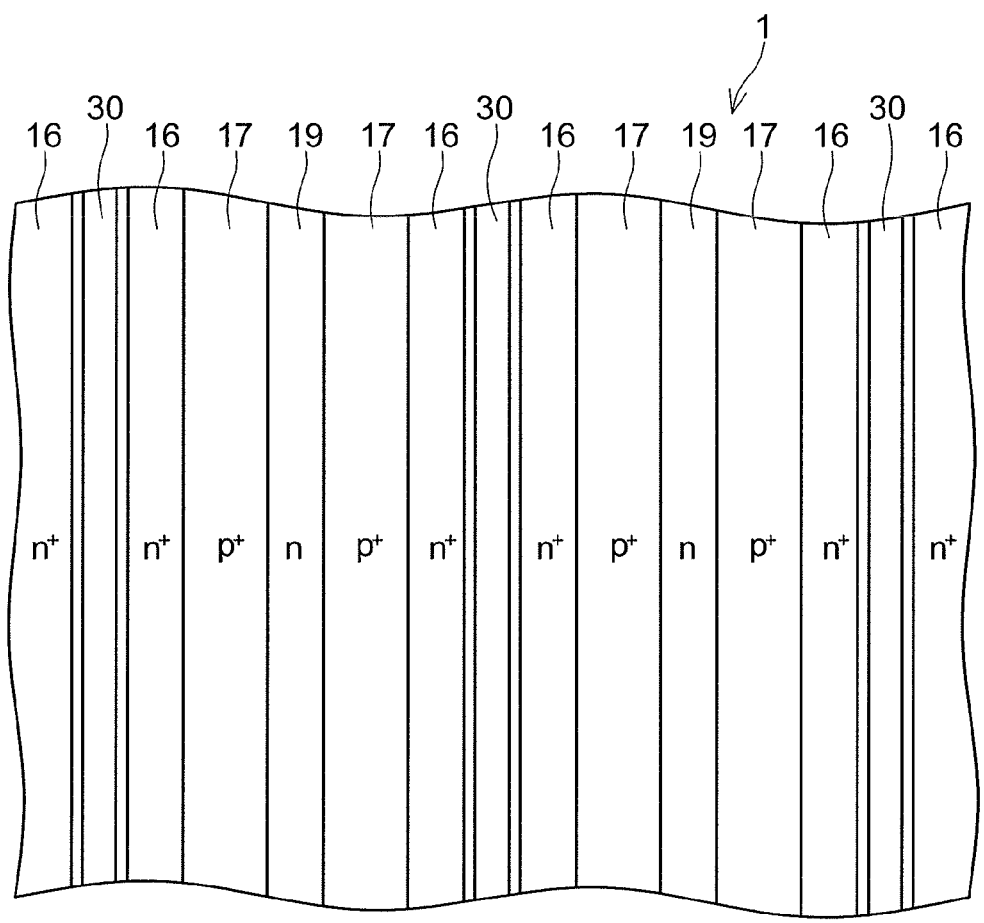
FIG. 2 shows schematically a cross section of the main part taken along a II-II line in FIG. 1.

Each insulated trench gate 30 is provided within a trench extending from the front surface 10B of the semiconductor layer 10 to the drift region 14 through the corresponding emitter region 16 and body region 15. The insulated trench gate 30 is in contact with the drift region 14, body region 15 and corresponding emitter region 16. The insulated trench gate 30 has a trench gate electrode and a gate insulation film covering the trench gate electrode. As shown in FIG. 2, the insulated trench gates 30 are disposed in stripes as viewed along a direction orthogonal to the front surface 10B of the semiconductor layer 10. This is an example of the layout of the insulated trench gates 30 and is not limited to a particular one. Therefore, various layouts of the insulated trench gates may be employed.

Figure 3:
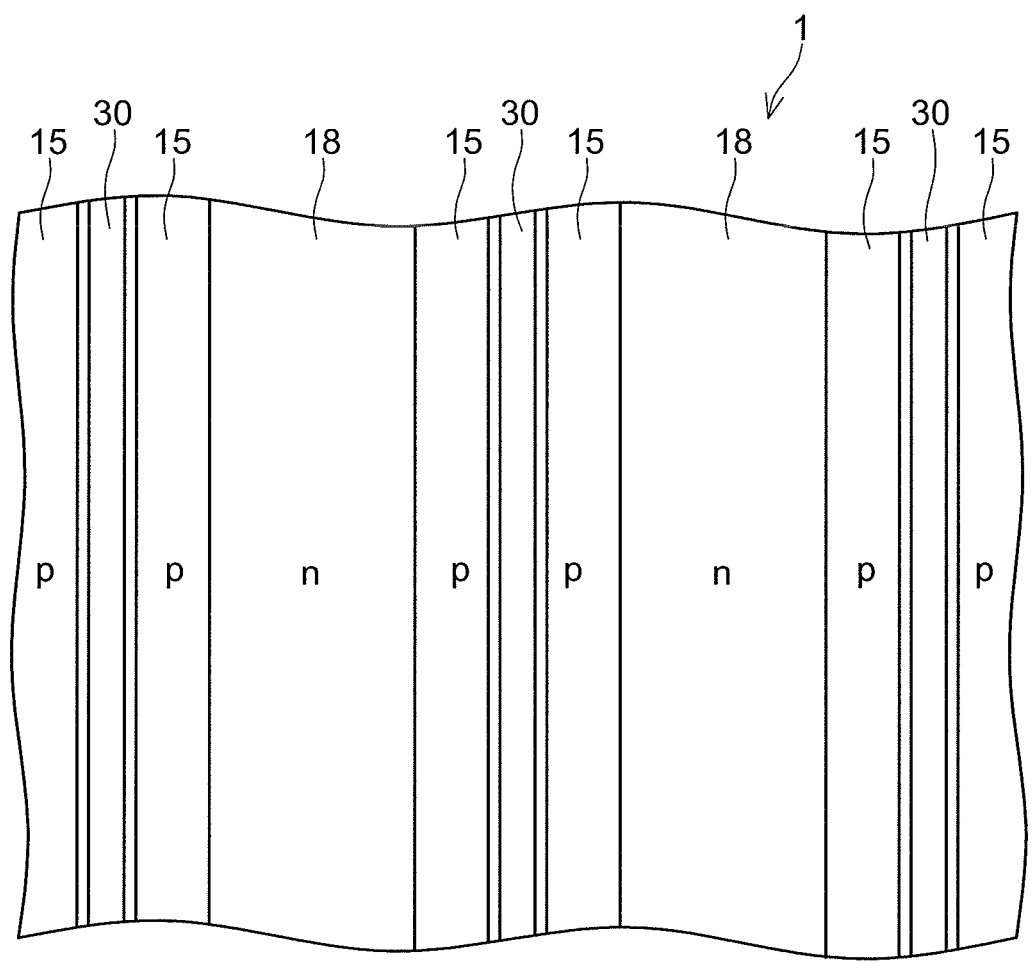
FIG. 3 shows schematically a cross section of the main part taken along a III-III line in FIG. 1.

As shown in FIG. 1, each barrier region 18 is disposed in the surface layer of the semiconductor layer 10. The barrier region 18 is disposed within the body region 15 and is separated from the drift region 14, emitter regions 16, and body contact regions 17 by the body region 15. The barrier region 18 has a shape extending in a plane parallel to the front surface 10B of the semiconductor layer 10. The barrier region 18 is formed by introducing phosphorus into a part of the surface layer of the semiconductor layer 10 from the front surface 10B of the semiconductor layer 10 by using, for example, the ion implantation technique. The barrier region 18 is located at a predetermined depth in the semiconductor layer 10. As shown in FIG. 3, each barrier region 18 has a shape extending along a longitudinal direction of the insulated trench gates 30 as viewed along the direction orthogonal to the front surface 10B of the semiconductor layer 10. The barrier regions 18 are disposed in stripes so as to correspond to the insulated trench gates 30 disposed in stripes. Each barrier region 18 is not in contact with side surfaces of the corresponding insulated trench gates 30. The body region 15 is interposed between each insulated trench gate 30 and the corresponding barrier region 18. A distance by which each barrier region 18 is set apart from a corresponding side surface of one insulated trench gate 30 is longer than a width of an inversion layer that is formed on the side surface of the insulated trench gate 30.

As shown in FIG. 1, each pillar region 19 is disposed in the surface layer of the semiconductor layer 10. The pillar region 19 extends from the front surface 10B of the semiconductor layer 10 to the corresponding barrier region 18 through the corresponding body contact region 17 and the corresponding upper body region 15a. The pillar region 19 has a shape extending along the direction orthogonal to the front surface 10B of the semiconductor layer 10. The pillar region 19 contains phosphorus and is in Schottky-contact with the emitter electrode 24. The pillar region 19 is formed by introducing phosphorus into a part of the surface layer of the semiconductor layer 10 from the front surface 10B of the semiconductor layer 10 by using, for example, the ion implantation technique.

Next, an operation of the reverse conducting IGBT 1 will be described. Upon application of a positive voltage to the collector electrode 22, application of a ground voltage to the emitter electrode 24, and application of the positive voltage to the insulated trench gates 30, an inversion layer is formed in the body region 15 on the side surfaces of the insulated trench gates 30. Via the inversion layer, electrons are injected into the drift region 14 from the emitter regions 16. Meanwhile, holes are injected into the drift region 14 from the collector region 11. Consequently, the reverse conducting IGBT 1 is turned on, so that a collector current flows between the collector electrode 22 and the emitter electrode 24.

Figure 9:
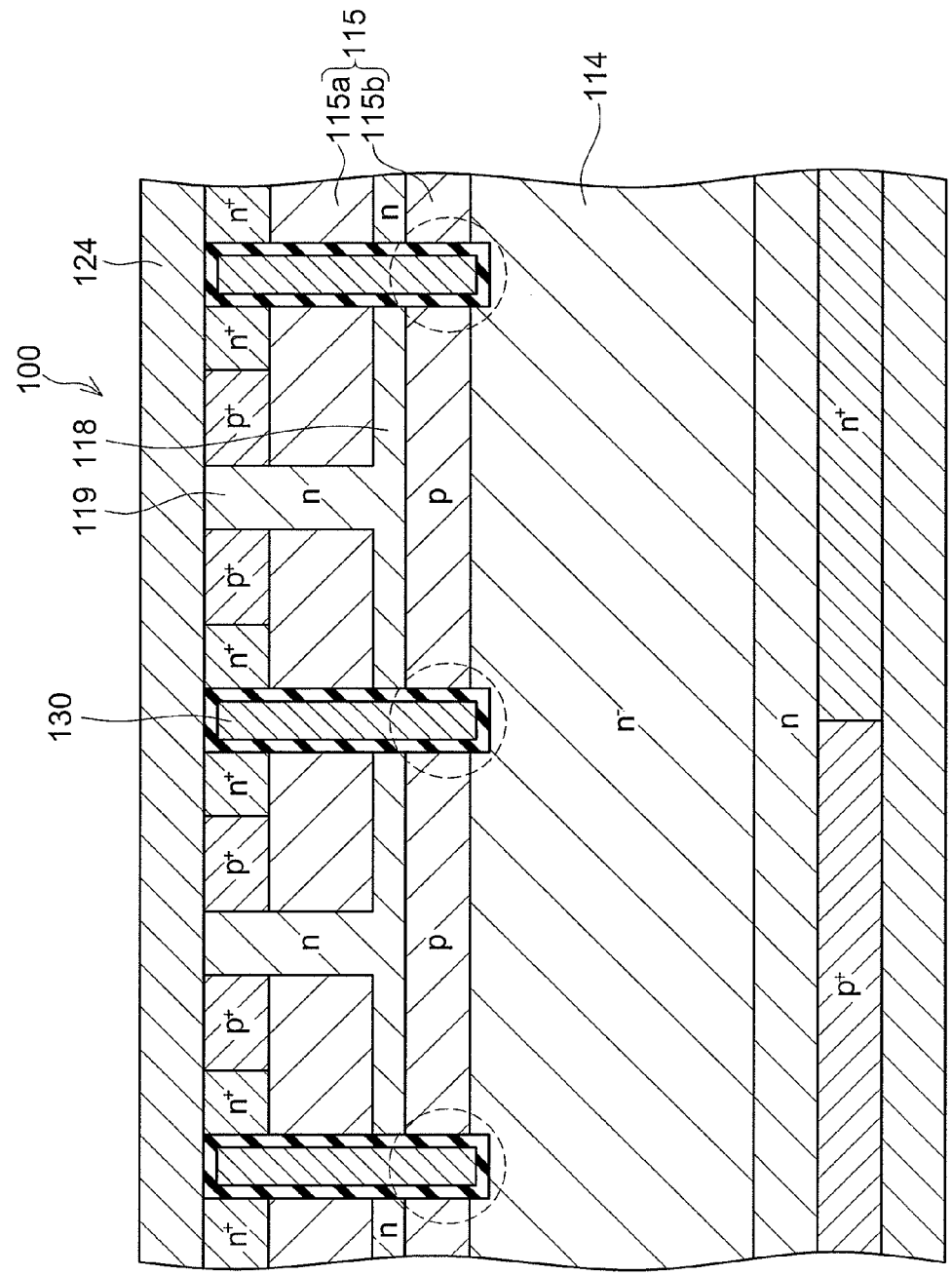
FIG. 9 shows schematically a cross section of a main part of a conventional reverse conducting IGBT.
Figure 10:
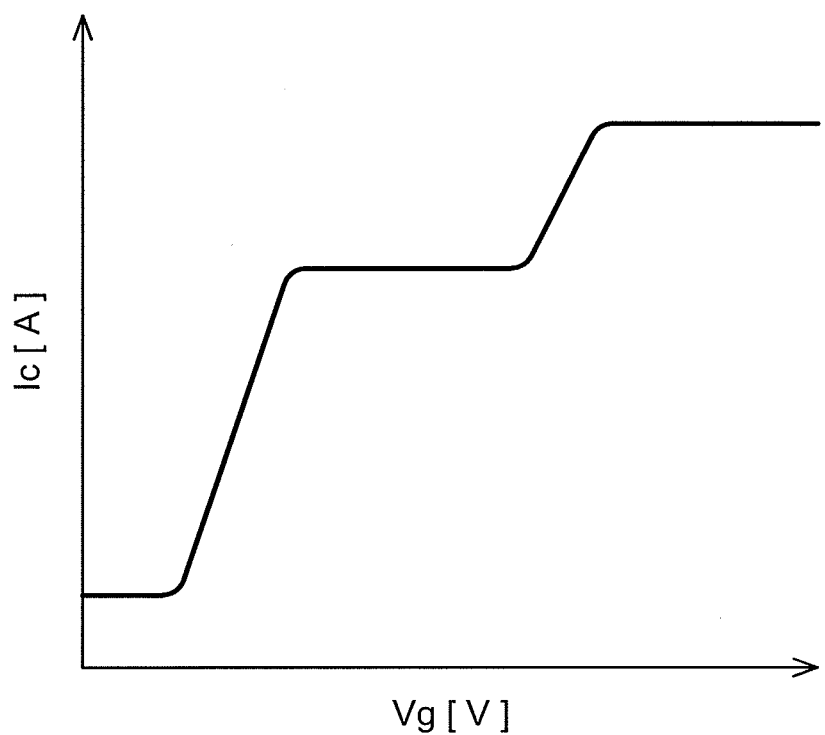
FIG. 10 shows Ic-Vg characteristics of the conventional reverse conducting IGBT.

As described in the related art (see FIG. 9), if the barrier regions 18 are in contact with the side surfaces of the insulated trench gates 30, a parasitic NMOS configured by the barrier regions 18, the lower body region 15b, and drift region 14 is generated in the side surfaces of the insulated trench gates 30. If the parasitic NMOS is turned on before reaching a threshold value, a two-step ON phenomenon is caused. Particularly, since the body region 15 is provided as a diffusion region, an impurity concentration in the lower body region 15b is lower than that of the upper body region 15a. Due to this, the parasitic NMOSs are turned on when the positive voltage applied to the insulated trench gates 30 is lower than the threshold value.

In contrast, in the reverse conducting IGBT 1 according to the present embodiment, since the barrier regions 18 are not in contact with the side surfaces of the insulated trench gates 30, no parasitic NMOS is present on the side surfaces of the insulated trench gates 30. Accordingly, in the reverse conducting IGBT 1 in the present embodiment, occurrence of the two-step ON phenomenon is inhibited.

Then, when a higher voltage is applied to the emitter electrode 24 than to the collector electrode 22, and a ground voltage is applied to the insulated trench gates 30, a built-in diode configured by the body region 15, drift region 14, buffer region 13, and cathode region 12 is forward-biased. When the built-in diode is forward-biased, the barrier regions 18 and emitter electrode 24 short-circuit via the pillar regions 19. Since the pillar regions 19 are in Schottky-contact with the emitter electrode 24, a potential of the barrier regions 18 becomes lower than that of the emitter electrode 24 by an amount corresponding to a forward voltage of the Schottky junction of the pillar regions 19 and emitter electrode 24. The forward voltage of the Schottky junction is lower than a built-in voltage of a PN diode configured by the upper body region 15a and barrier regions 18. Therefore, provision of the barrier regions 18 hinders sufficient forward voltage from being applied to the PN diode configured by the upper body region 15a and barrier regions 18. Accordingly, the quantity of holes injected from the upper barrier region 15a is restricted.

Next, when a positive voltage is applied to the collector electrode 22, a ground voltage is applied to the emitter electrode 24, and the ground voltage is applied to the insulated trench gates 30, the built-in diode is reverse-biased. As described above, in the built-in diode, the quantity of holes injected from the upper body region 15a at when this diode is forward-biased is restricted. Therefore, a reverse recovery current is small and hence reverse recovery time is short. This way, the reverse conducting IGBT 1 having the barrier regions 18 is able to keep switching loss low without performing life time control on the drift region 14.

(Modified Examples)

Figure 4:
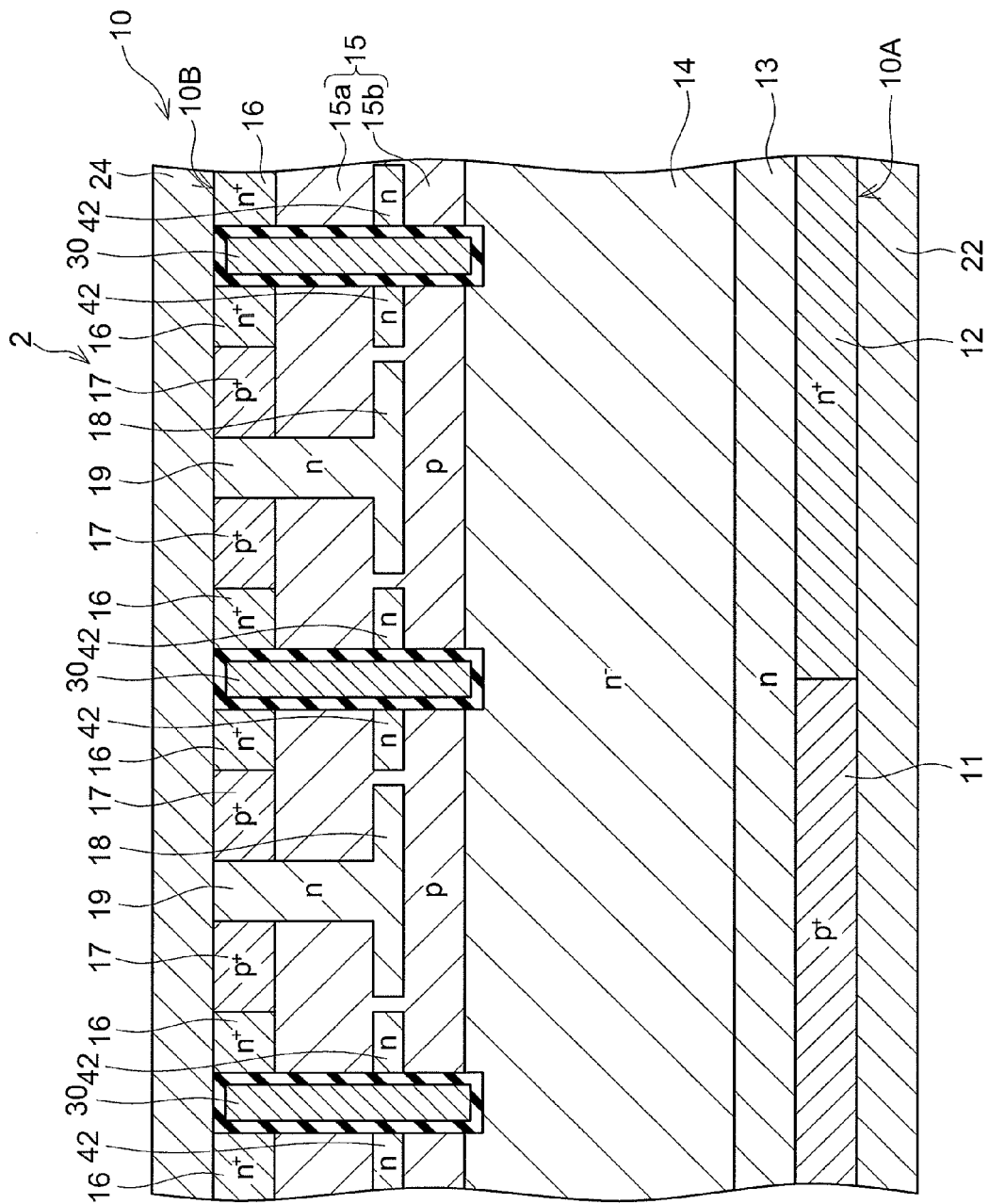
FIG. 4 shows schematically a cross section of a main part of a reverse conducting IGBT according to a modified example.

FIG. 4 shows a reverse conducting IGBT 2 of a modified example. A semiconductor layer 10 of the reverse conducting IGBT 2 is characterized by including an n-type floating region 42 of which potential is floating. The floating regions 42 are disposed in a surface layer of the semiconductor layer 10. The floating regions 42 are disposed in a body region 15, are in contact with side surfaces of insulated trench gates 30, and are separated from a drift region 14, emitter regions 16, body contact regions 17, bather regions 18, and pillar regions 19 by the body region 15. Each floating region 42 is formed by introducing phosphorus into a part of the surface layer of the semiconductor layer 10 from the front surface 10B of the semiconductor layer 10 by using, for example, the ion implantation technique.

When the reverse conducting IGBT 2 is turned on, most of holes injected into the drift region 14 from a collector region 11 flow in the body region 15 along the side surfaces of the insulated trench gates 30 and then are emitted via the body contact regions 17. By virtue of the floating regions 42, an obstacle is provided against holes flowing on the side surfaces of the insulated trench gates 30. Accordingly, a concentration of holes in the drift region 14 and body region 15 increases, and therefore ON voltage of the reverse conducting IGBT 2 decreases.

Figure 5:
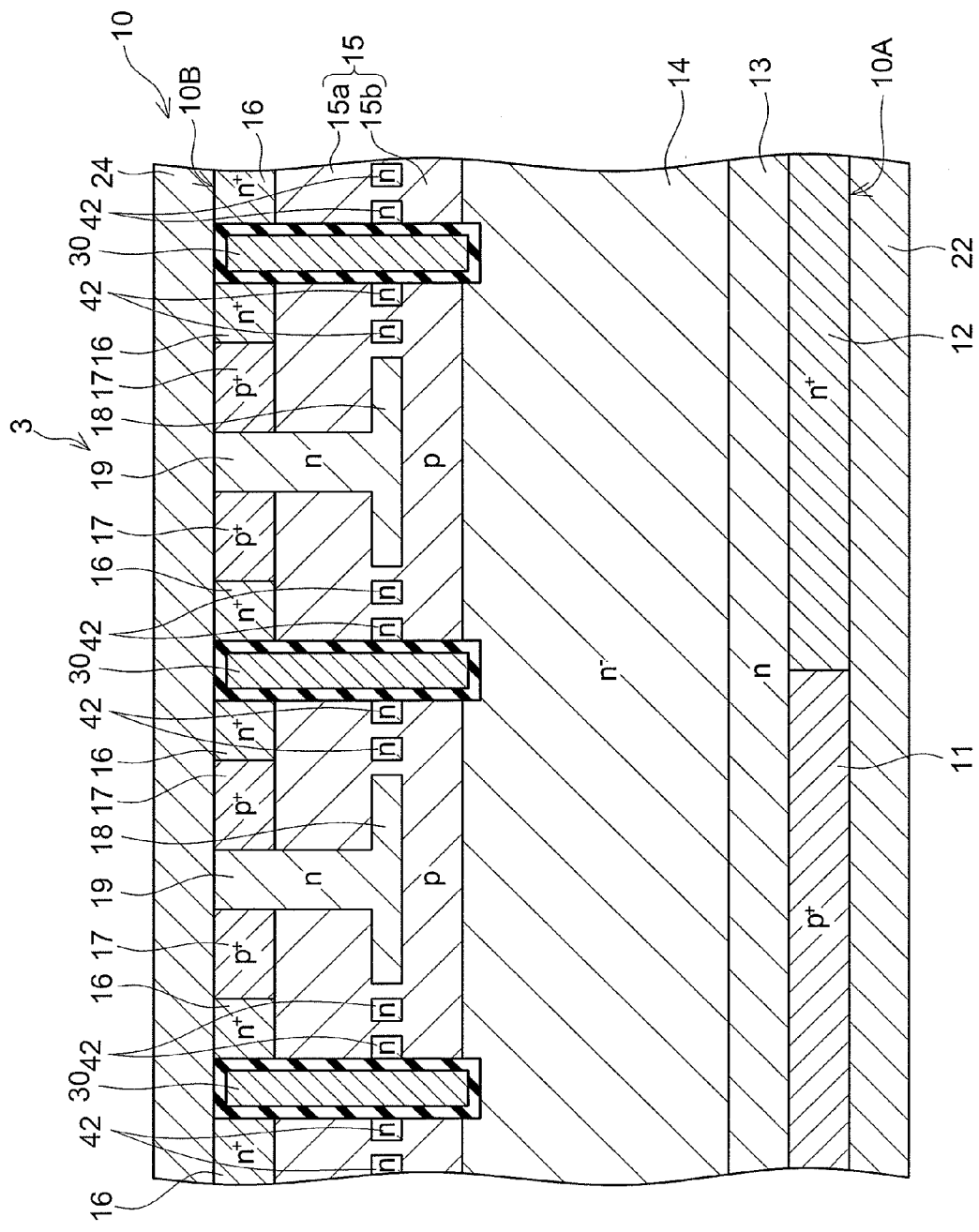
FIG. 5 shows schematically a cross section of a main part of a reverse conducting IGBT according to another modified example.

FIG. 5 shows a reverse conducting IGBT 3 of another modified example. The reverse conducting IGBT 3 is characterized in that floating regions 42 are dispersed between the barrier regions 18 and the insulated trench gates 30. A layout of the floating regions 42 may be suitably adjusted according to desired characteristics.

Figure 6:
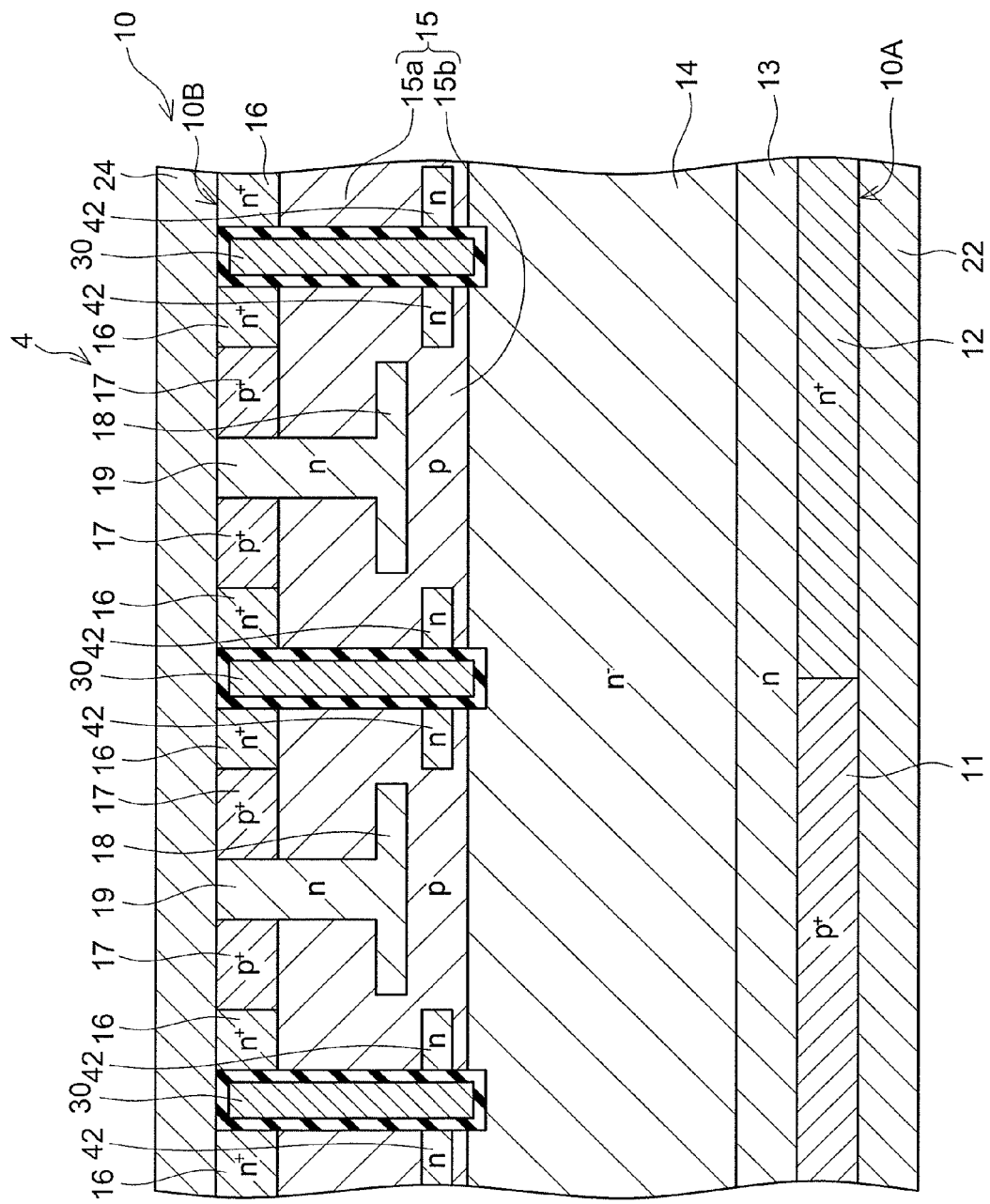
FIG. 6 shows schematically a cross section of a main part of a reverse conducting IGBT according to another modified example.

FIG. 6 shows a reverse conducting IGBT 4 of another modified example. The reverse conducting IGBT 4 is characterized in that floating regions 42 are disposed on a lower side with respect to barrier regions 18 in a thickness direction of a semiconductor layer 10 (in a vertical direction in the drawing). In this example, since a distance between the floating regions 42 and a drift region 14 is short, a concentration of holes in the drift region 14 notably increases. This activates conductivity modulation in the drift region 14, thus notably decreasing ON voltage of the reverse conducting IGBT 4.

Figure 7:
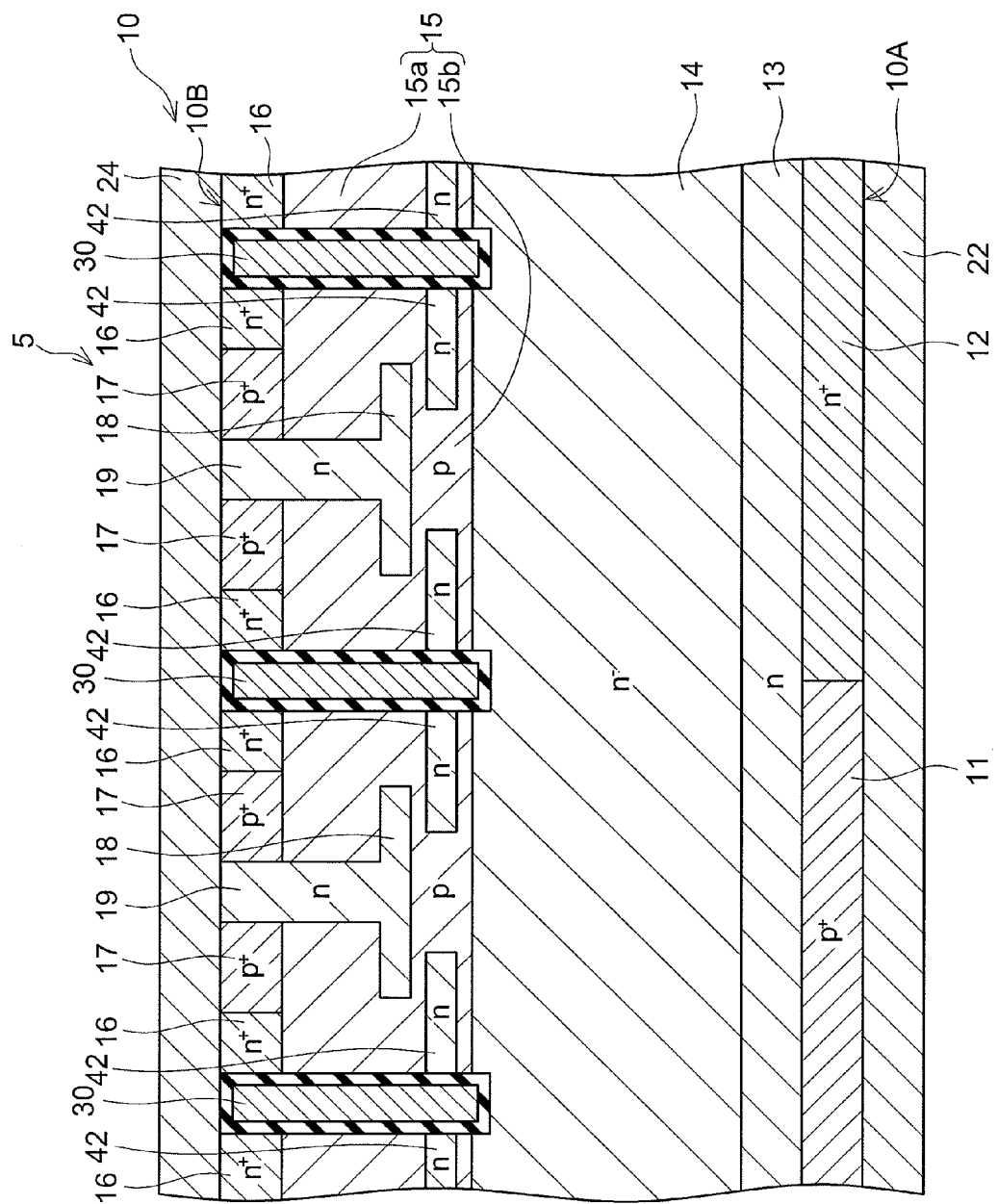
FIG. 7 shows schematically a cross section of a main part of a reverse conducting IGBT according to another modified example.

FIG. 7 shows a reverse conducting IGBT 5 of another modified example. The reverse conducting IGBT 5 is characterized in that floating regions 42 extend from the side surfaces of corresponding insulated trench gates 30 to overlapping areas with barrier regions 18 as viewed from the direction orthogonal to the front surface 10B of the semiconductor layer 10. In this example, since a distance of a emission path of holes from a lower side of each floating region 42 to a corresponding body contact region 17, a concentration of holes in the drift region 14 notably increases. This activates conductivity modulation in the drift region 14, thus notably decreasing ON voltage of the reverse conducting IGBT 5.

Figure 8:
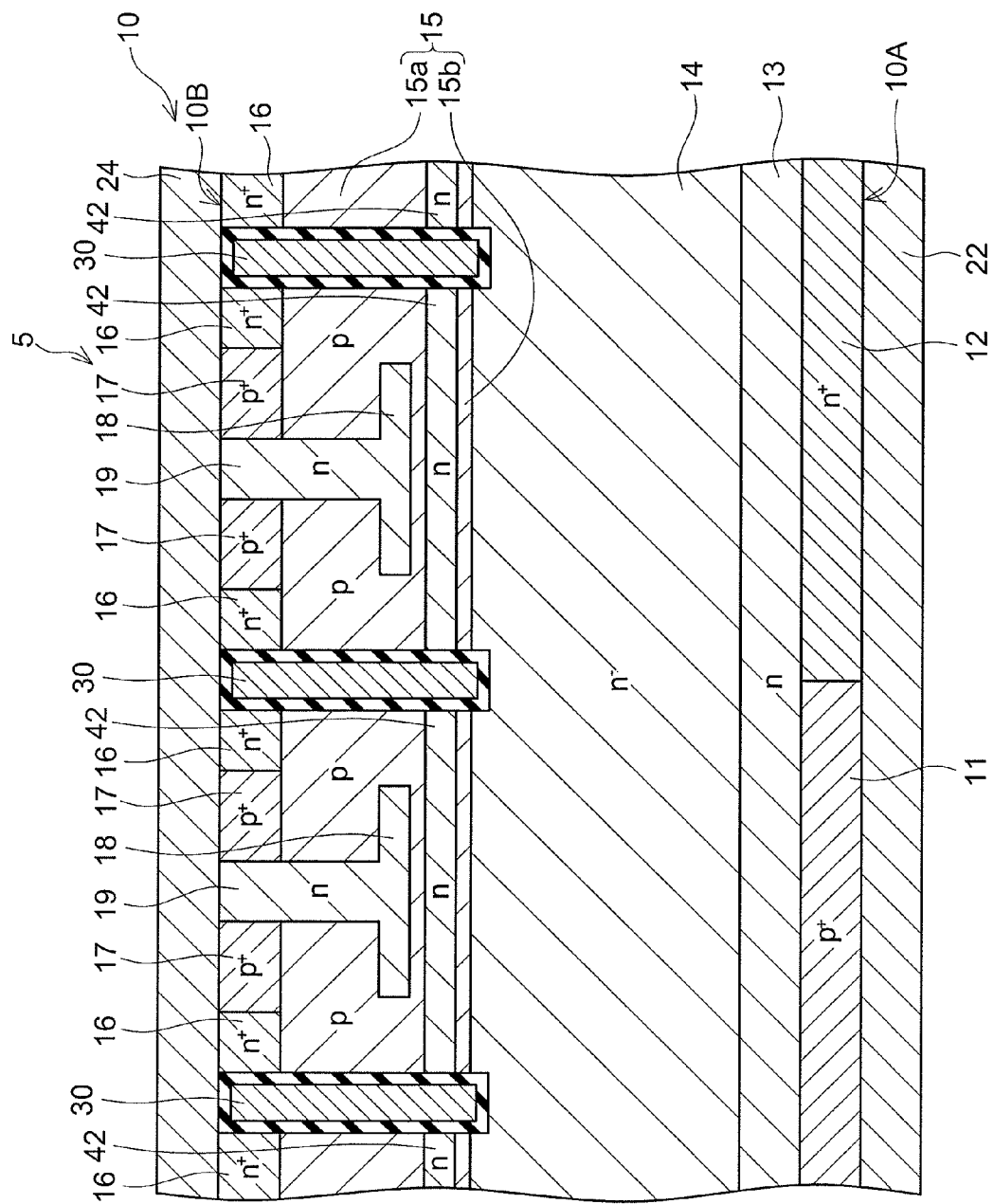
FIG. 8 shows schematically a cross section of a main part of a reverse conducting IGBT according to another modified example.

FIG. 8 shows a reverse conducting IGBT 6 of another modified example. The reverse conducting IGBT 6 is characterized in that, between adjacent insulated trench gates 30 as viewed from the direction orthogonal to the front surface 10B of the semiconductor layer 10, each floating region 42 extends from a corresponding side surface of one insulated trench gate 30 to a corresponding side surface of the other insulated trench gate 30. In this example, since the floating regions 42 are able to form a secure obstacle against holes injected from the collector region 11, a concentration of holes in the drift region 14 notably increases. This activates conductivity modulation in the drift region 14, thus notably decreasing ON voltage of the reverse conducting IGBT 6.

What is claimed is:

1. A reverse conducting insulated gate bipolar transistor comprising:
   a semiconductor layer;
   an emitter electrode covering one of main surfaces of the semiconductor layer; and
   an insulated trench gate extending from the one of main surfaces of the semiconductor layer into the semiconductor layer, wherein
   the semiconductor layer comprises:
      a drift region of a first conductive type, wherein the drift region is in contact with the insulated trench gate;
      a body region of a second conductive type, wherein the body region is disposed above the drift region and is in contact with the insulated trench gate;
      an emitter region of the first conductive type, wherein the emitter region is disposed above the body region, is in contact with a side surface of the insulated trench gate, and is electrically connected to the emitter electrode; and a barrier region of the first conductive type, wherein the barrier region is disposed in the body region and electrically connects to the emitter electrode via a pillar member which extends from the one of main surfaces of the semiconductor layer, the barrier region is not in contact with a side surface of the insulated trench gate, and in a view along a direction orthogonal to the one of the main surfaces of the semiconductor laver, at least a part of the emitter region is located between the side surface of the insulated trench gate and the barrier region.

2. The reverse conducting insulated gate bipolar transistor according to claim 1, wherein a distance by which the barrier region is set apart from the side surface of the insulated trench gate is longer than a width of an inversion layer that is generated at the side surface of the insulated trench gate.

3. The reverse conducting insulated gate bipolar transistor according to claim 1, wherein the semiconductor layer further comprises a floating region of the first conductive type, wherein the floating region is disposed in the body region and its potential is floating, and in the view along a direction orthogonal to the one of main surfaces of the semiconductor layer, the floating region is located in at least a portion between the side surface of the insulated trench gate and the barrier region.

4. he reverse conducting insulated gate bipolar transistor according to claim 3, wherein the floating region is located on a lower side with respect to the barrier region in a depth direction of the semiconductor layer.

5. The reverse conducting insulated gate bipolar transistor according to claim 4, wherein the floating region extends from the side surface of the insulated trench gate to an overlapping area with the barrier region in the view along the direction orthogonal to the one of main surfaces of the semiconductor layer.

* * * * *